United States Patent
Di Franco

(10) Patent No.: US 9,054,225 B2
(45) Date of Patent: Jun. 9, 2015

(54) INTEGRATED CAPACITOR HAVING A NON-UNIFORM THICKNESS

(75) Inventor: Antonio Di Franco, Osnago (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 708 days.

(21) Appl. No.: 12/649,235

(22) Filed: Dec. 29, 2009

(65) Prior Publication Data

US 2010/0164066 A1    Jul. 1, 2010

(30) Foreign Application Priority Data

Dec. 30, 2008    (IT) .............................. MI2008A2353

(51) Int. Cl.
| | |
|---|---|
| *H01L 21/02* | (2006.01) |
| *H01L 49/02* | (2006.01) |
| *H01L 23/522* | (2006.01) |

(52) U.S. Cl.
CPC ............ *H01L 28/87* (2013.01); *H01L 23/5223* (2013.01); *H01L 28/75* (2013.01); *H01L 28/86* (2013.01)

(58) Field of Classification Search
USPC ................................................ 257/532, 534
See application file for complete search history.

(56) References Cited

U.S. PATENT DOCUMENTS

| | | | | |
|---|---|---|---|---|
| 6,524,905 | B2 * | 2/2003 | Yamamichi et al. | 438/240 |
| 6,552,384 | B2 * | 4/2003 | Murata et al. | 257/307 |
| 6,809,338 | B2 * | 10/2004 | Murade | 257/72 |
| 6,825,080 | B1 * | 11/2004 | Yang et al. | 438/250 |
| 2002/0024079 | A1 | 2/2002 | Nagano | |
| 2005/0082636 | A1 * | 4/2005 | Yashima et al. | 257/532 |
| 2007/0042542 | A1 * | 2/2007 | Barth et al. | 438/243 |
| 2007/0152258 | A1 * | 7/2007 | Kim | 257/309 |
| 2007/0164434 | A1 * | 7/2007 | Watanabe | 257/758 |
| 2008/0054329 | A1 * | 3/2008 | Kim et al. | 257/306 |
| 2008/0157276 | A1 | 7/2008 | Park | |

FOREIGN PATENT DOCUMENTS

EP    1128418    8/2001

OTHER PUBLICATIONS

Italian Search Report for MI2008A002353, Filed Dec. 30, 2008.

* cited by examiner

*Primary Examiner* — Benjamin Sandvik
(74) *Attorney, Agent, or Firm* — Gardere Wynne Sewell LLP

(57) ABSTRACT

An embodiment of an electronic device integrated in a chip of semiconductor material and an embodiment of a corresponding production method are proposed. The electronic device includes a capacitor having a first conductive plate, a second conductive plate, and an insulating layer for insulating the first plate from the second plate. In an embodiment of the disclosure, at least a selected one between the first plate and the second plate has a non-uniform thickness.

23 Claims, 7 Drawing Sheets

INTEGRATED CAPACITOR HAVING A NON-UNIFORM THICKNESS

PRIORITY CLAIM

The instant application claims priority to Italian Patent Application No. MI2008A002353, filed Dec. 30, 2008, which application is incorporated herein by reference in its entirety.

TECHNICAL FIELD

An embodiment of the present disclosure relates to the field of microelectronics. More specifically, such embodiment relates to integrated capacitors.

BACKGROUND

Capacitors are components of common use in most of electronic circuits Referring in particular to an electronic device integrated in a chip of semiconductor material, different techniques are known to make the capacitors on the same chip in which there are made other components of the electronic device, both passive ones (such as resistors) and active ones (such as transistors).

For example, (integrated) capacitors of Metal-Oxide-Metal (or MOM) type are formed by two metal plates enclosing a silicon oxide layer; MOM capacitors are currently the preferred choice in many kinds of electronic devices because of their implementation simplicity.

On the contrary, capacitors of Metal-Insulator-Metal (or MIM) type are formed by two metal plates enclosing an insulating layer (for example, silicon nitride). The silicon nitride has a high dielectric constant, so that the MIM capacitors have a specific capacity (per unit area of their plates) that is greater than that of the MOM capacitors; this allows making more compact capacitors that take up a smaller area of the chip (for the same overall capacity). Moreover, the MIM capacitors do not exclude the possibility of integrating other components under them (with a further saving of area of the chip).

However, the MIM capacitors suffer from some drawbacks that may limit their use (in spite of their better electrical characteristics with respect to the MOM capacitors).

In particular, when MIM capacitors are integrated with power components, the bottom plate may have a relatively large thickness; in fact, the bottom plate is made through a dedicated portion of a buried metal layer of the electronic device, whose thickness depends on the requirements of its power components. For example, in case of bipolar-CMOS-DMOS (BCD) technology—wherein BJTs for precision analog applications, CMOSs for digital applications, and DMOSs for power applications are integrated in the same chip—such metal layer has a typical thickness of approximately 0.7-1.0 μm (in order to reduce the ON resistance of the power components and to also reduce the electro-migration phenomena).

However, the relatively large thickness of the bottom plate may cause the formation of hillocks because of its thermoplastic deformation due to the high temperatures to which the bottom plate is subject during the operations following its construction; moreover, this involves a thick grain structure of the bottom plate, which causes kinks and superficial irregularities. As a consequence, electric fields having high intensity may form between the plates, thereby reducing a voltage breakdown of the capacitor.

On the contrary, the top plate may have a thickness being less than that of the bottom plate; in fact, the top plate may be made within an insulating layer protecting the metal layer in which the bottom plate is made, so that the thickness of the top plate is significantly lower than the thickness of the insulating layer; in the same above-described BCD technology wherein the insulating layer has a typical thickness of approximately 0.7-1.0 μm, the thickness of the top plate may be of the order of approximately 0.1-0.3 μm.

However, the relatively large difference between the thickness of the bottom plate and the thickness of the top plate (for example, in a ratio of about 4-5) may cause imbalances that involve mechanical stresses on the capacitor. Moreover, the construction of a contact terminal (or simply contact) of the top plate may be critical. In fact, for this purpose it may be necessary to open a corresponding hole through the overlying insulating layer by means of an etching process; such insulating layer, being thick enough in correspondence of the metal layer used by the bottom plate and by the other components of the electronic device, may be thinner in correspondence to the top plate placed above such metal layer (for example, approximately 0.4-0.8 μm); therefore, there exists a risk of reaching the insulating layer that separates the two plates, thereby causing the destruction of the capacitor. In order to avoid such problem, one may use detection systems to detect a stop-point of the etching process; however, this may require the use of very sophisticated and expensive machinery, with a consequent increase in the production cost of the capacitor and hence of the whole electronic device.

SUMMARY

In its general terms, an embodiment of the present disclosure is based on the idea of using plates having non-uniform thickness.

More specifically, an embodiment of the disclosure proposes an electronic device, which is integrated in a chip of semiconductor material. The electronic device includes a capacitor (for example, of the MIM type) having a first conductive plate, a second conductive plate, and an insulating layer for isolating the first plate from the second plate. At least a selected one between the first plate and the second plate (such as the bottom plate within the chip) has a non-uniform thickness. For example, the bottom plate includes a thin prevalent portion and a thick residual portion, which is used for electrically contacting the bottom plate from a main surface in the chip (with such thick portion corresponding to a metal layer being used for electrically contacting other components of the electronic device—for example, according to the BCD technology).

A further embodiment of the disclosure proposes a system including one or more of such electronic devices.

Another embodiment of the disclosure proposes a method for producing the electronic device. For example, in an embodiment of the disclosure the non-uniform thickness of the selected plate is obtained by forming a first metal layer, selectively removing it (in a region corresponding to a prevalent portion thereof), and then forming a second metal layer. Moreover, it also may be possible to clean an exposed surface of the first metal layer from a layer of native oxide before forming the second metal layer. In an embodiment of the disclosure, an edge portion of the first metal layer has a slanted profile.

BRIEF DESCRIPTION OF THE DRAWINGS

One or more embodiments of the disclosure, as well as features and the advantages thereof, will be best understood with reference to the following detailed description, given purely by way of a non-restrictive indication, to be read in conjunction with the accompanying drawings. In this regard, it is expressly intended that the figures are not necessarily drawn to scale and that, unless otherwise indicated, they are simply used to conceptually illustrate the described structures and procedures. In particular.

DETAILED DESCRIPTION

Figure 1:
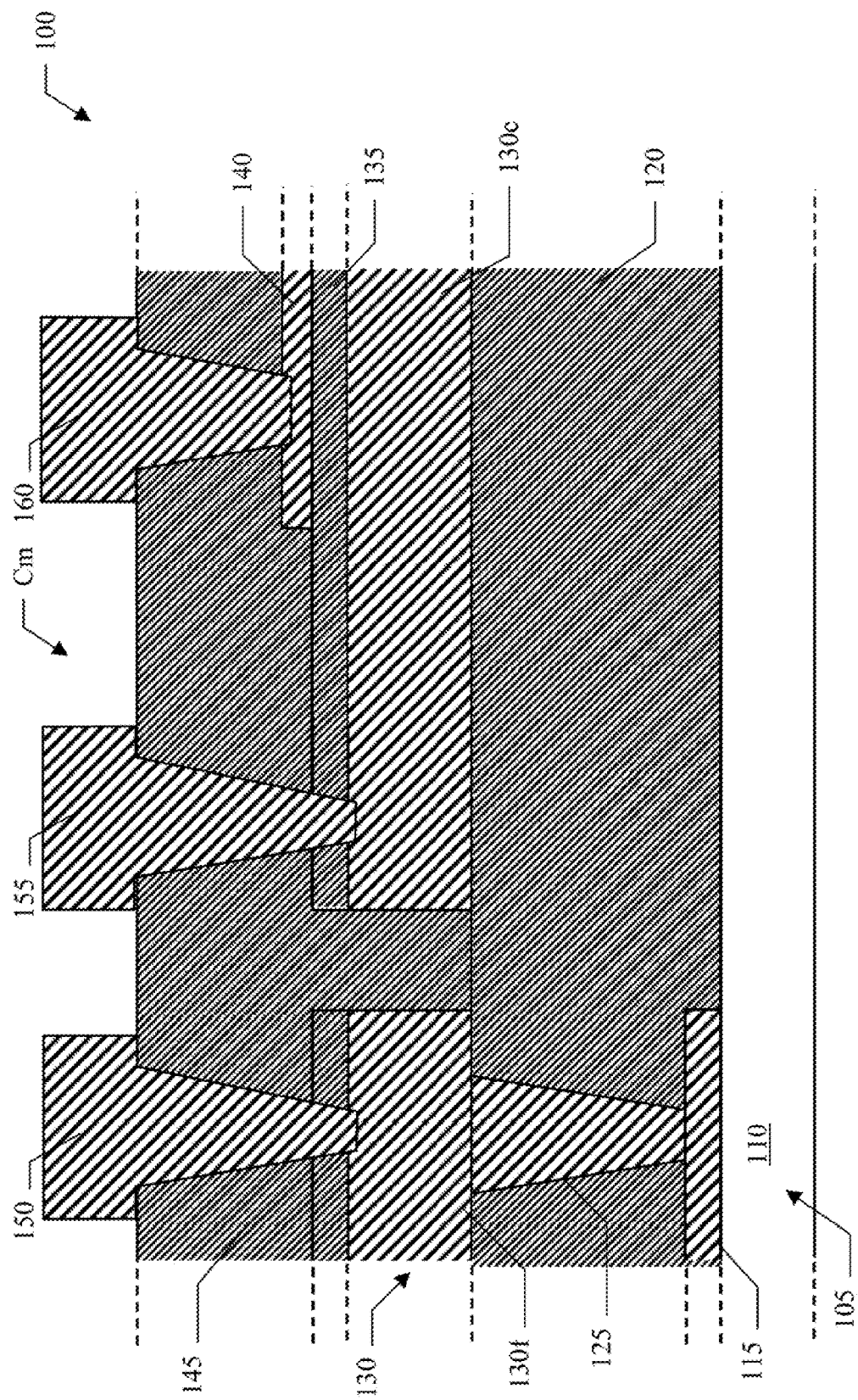
FIG. 1 is a schematic cross-section view of a conventional electronic device.

With reference in particular to FIG. 1, there is shown a schematic cross-section view of an electronic device 100 known in the art, which includes a capacitor Cm of the MIM type. The electronic device 100 is integrated in a chip of semiconductor material (such as silicon); for example, the electronic device 100 is made in BCD technology with three metal levels.

In detail, the electronic device 100 includes a functional layer 105 (for example, including a mono-crystalline silicon substrate on which an epitaxial layer is grown), in which there are integrated various functional components denoted as a whole with the reference 110 (such as BJTs, CMOSs and DMOSs). A metal layer 115, suitably patterned, is used for electrically contacting the functional components 110 on a top surface of the functional layer 105. An insulating layer 120 completely covers the functional layer 105 and the metal layer 115. Via-holes 125 (one being shown for the sake of illustration simplicity) cross the insulating layer 120. A metal layer 130 is arranged on a top surface of the insulating layer 120. The via-holes 125 electrically connect a (suitably patterned) portion of the metal layer 130, indicated with the reference 130f, to a metal layer 115. A further portion of the same metal layer 130, indicated with the reference 130c, instead defines a bottom plate of the capacitor Cm. The metal layer 130 is covered by a thin insulating layer 135. A metal layer 140 arranged on the insulating layer 135 defines a top plate of the capacitor Cm (with the plates 130 and 140 that are separated by the insulating layer 135). A further insulating layer 145 completely covers such structure, so as to protect the whole electronic device 100. The electronic device 100 is provided with contacts, each one formed by a via crossing the insulating layer 145 and ending with a terminal (for example, a pad) in correspondence of a free upper surface of the insulating layer 145 (which defines a main surface of the electronic device 100). In particular, contacts 150 having a via coupled to the (functional) portion of the metal layer 130f (one shown in the figure for the sake of illustration simplicity) are used for electrically contacting the functional components 110 (through the vias 125 and the metal layer 115). A contact 155 coupled to the bottom plate 130c and a contact 160 coupled to the top plate 140 are instead used for electrically contacting the capacitor Cm.

As it may be noticed, the bottom plate 130c has a relatively large thickness, for example equal to that of the metal layer 130 (for example, approximately 0.7-1.0 μm). The top plate 140 instead has a smaller thickness (for example, approximately 0.1-0.3 μm within the insulating layer 145 of approximately 0.7-1.0 μm), with a relatively large thickness difference between the bottom plate 130c and the top plate 140 (in a ratio of about 4-5 in this example). Moreover, the thickness of the insulating layer 145 to be etched for making the via of the contact 160 (so as to reach the top plate 140) may be limited, for example, to approximately 0.4-0.8 μm versus the approximately 0.7-1 μm of the insulating layer 145 to be etched for making the vias of the contacts 150 and 155 (so as to reach the metal layer 130).

Figure 2:
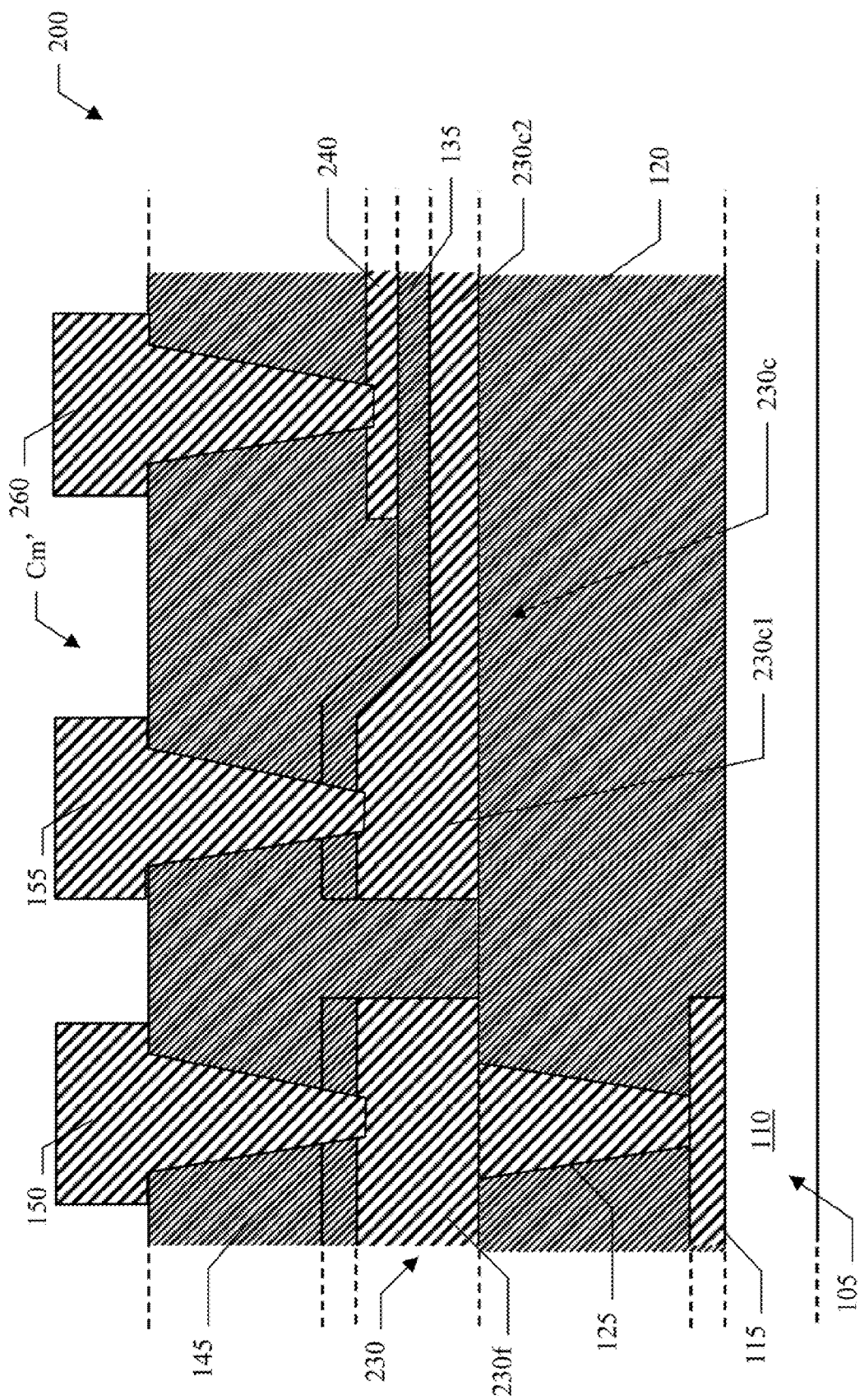
FIG. 2 is a schematic cross-section view of an electronic device according to an embodiment of the disclosure.

Turning now to FIG. 2, there is instead shown a schematic cross-section view of an electronic device 200 according to an embodiment of the disclosure (in the following, the elements corresponding to those shown in the previous figures are denoted with the same references, and their explanation is omitted for the sake of exposition brevity).

As above, the electronic device 200 includes a capacitor of the MIM type (indicated by the reference Cm'). In such case, however, at least one of the plates of the capacitor Cm' has a non-uniform thickness.

For example, the electronic device 200 includes a similar metal layer 230 (arranged on the insulating layer 120), which has again a functional portion coupled to the vias 125 (indicated by the reference 230f) having the same thickness as above. Instead, the bottom plate of the capacitor Cm' (indicated with the reference 230c) is now formed by a thick portion 230c1 and a thin portion 230c2. The thick metal layer 230c1 may have the same thickness of the functional metal layer 230f, while the thin metal layer 230c2 may have a smaller thickness; for example, a ratio between the thickness of the thin metal layer 230c2 and the thickness of the thick metal layer 230c1 ranges from approximately between 0.2 and 0.8, for example, from approximately between 0.3 and 0.7, for example, from approximately between 0.4 and 0.6 (for example, equal to about 0.5). The thick metal layer 230c1 is used to be electrically contacted by the via of the contact 155 (hence it has a corresponding extent, for example, approximately 0.1-2 μm); on the contrary, the thin metal layer 230c2 defines a prevalent portion of the bottom plate 230c (that substantially occupies all of its surface, for example, approximately 50-50.000 μm$^2$).

Therefore, the reduction of the thickness of the bottom plate 230c (in its portion 230c2) may substantially limit the formation of hillocks (during the operations at high temperatures following its construction); moreover, this may allow obtaining a fine grain structure of the bottom plate 230c, with small kinks and superficial irregularities. In this way, it may be possible to obtain higher breakdown voltages of the capacitor Cm'.

Moreover, the top plate of the capacitor (indicated with the reference 240) is now arranged on the insulating layer 135 over the thin metal layer 230c2. Therefore, the top plate 240 is deeper within the insulating layer 145 as compared to the structure of FIG. 1. As a consequence, it may be possible to make the top plate 240 with a greater thickness (for example, approximately 0.2-0.4 μm). This may considerably reduce the difference between the thickness of the bottom plate 230c (in its portion 230c2) and the thickness of the top plate 240 (for example, in a ratio of about 1-3); the capacitor Cm' may hence be better balanced, with a reduction of the mechanical stresses on it.

At the end, it is possible to keep the top plate 240 at a depth comparable to (or even greater than) the one of the metal layer 230. In this way, the insulating layer 145 to be etched in order to make the via of the contact for reaching the top plate 240 (indicated with the reference 260) now has a sufficiently large thickness (for example, approximately 0.7-1 μm), which is comparable to the one for making the vias of the contacts 150 and 155 (for reaching the functional metal layer 230f and the thick metal layer 230c1 of the bottom plate 230, respectively). Therefore, the etching process through the insulating layer 145 (for opening the corresponding hole) may no longer have any criticalities; in particular, the relatively large thickness of the insulating layer 145 above the top plate 240 helps avoid a risk of reaching the insulating layer 135 separating the two plates 230c and 240. As a consequence, a detection system of a stop-point of the etching process may no longer be required; this may allow using less sophisticated and expensive machineries, with a consequent reduction in the production cost of the capacitor Cm', and hence of the whole electronic device 200.

The various steps of a production process for producing the above-described electronic device according to an embodiment of the disclosure are shown in FIG. 3A-3H. In general, the production process is performed at the level of a wafer of semiconductor material, wherein, substantially completely identical electronic devices are made simultaneously in a large number for being separated at the end through a cutting operation (for the sake of simplicity of description, however, in the following reference will be make to one of these electronic devices).

Figure 3A:
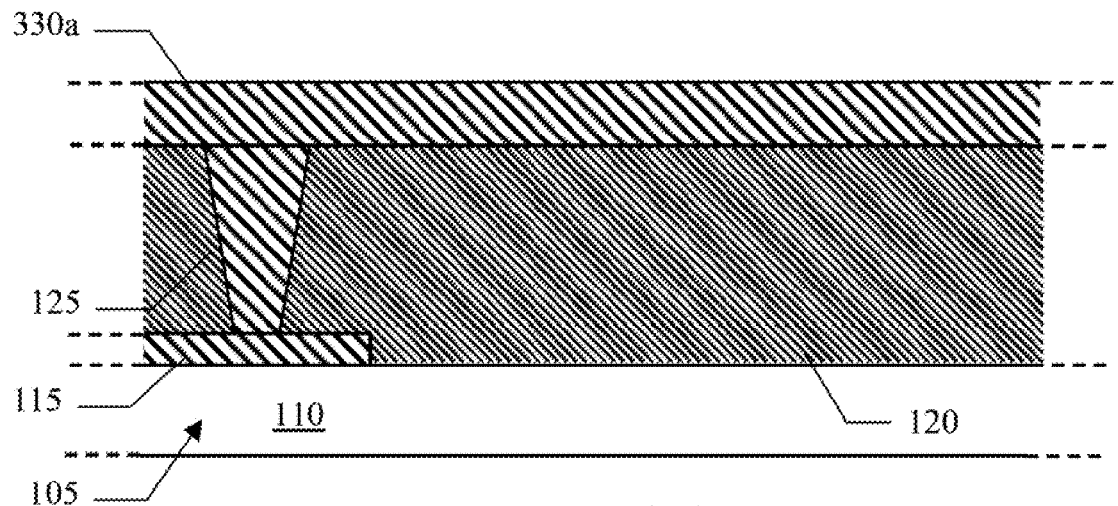
FIGS. 3A-3H show the various steps of a production process for making the electronic device of FIG. 2 according to an embodiment of the disclosure.

Considering in particular FIG. 3A, the description of an embodiment of the production process begins once there have been completed the functional layer 105 (with the corresponding functional components 110), the metal layer 115, the insulating layer 120 and the vias 125 (through standard process steps of the BCD technology). At this point, a metal layer 330a is deposited on the whole insulating layer 120. For example, initially a thin titanium layer (having a thickness of approximately 5-15 nm) that makes easier the adhesion with the insulating layer 120 is deposited; an aluminum layer having the desired thickness (for example, approximately 0.4-0.5 μm) is then deposited on the titanium layer.

Figure 3B:
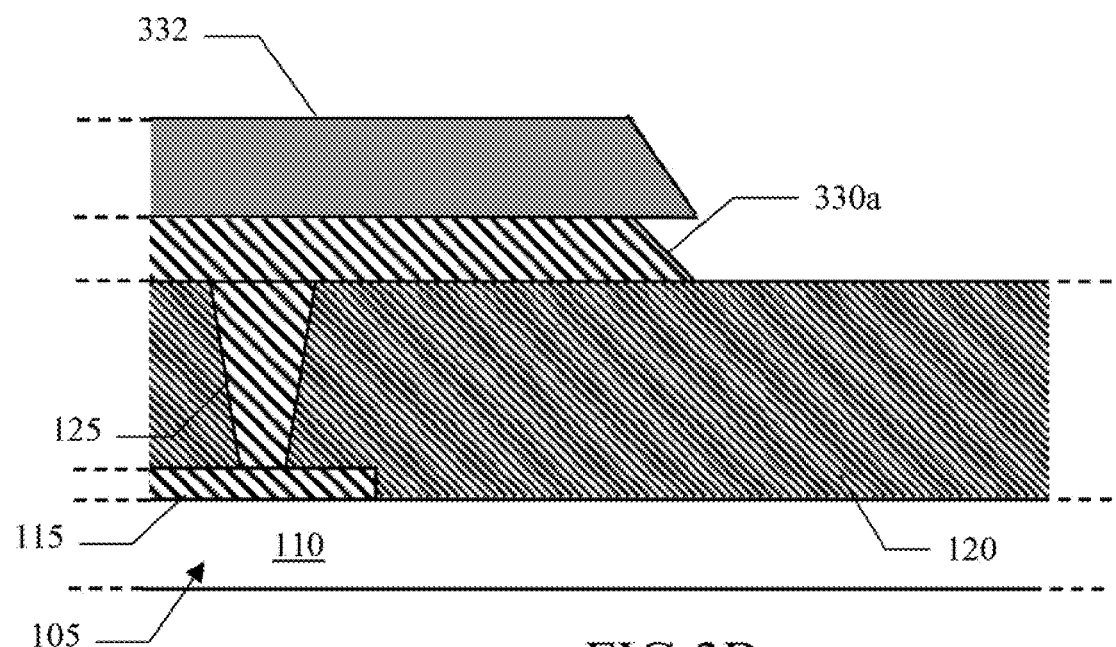

Turning to FIG. 3B, a photo-resist mask 332 (for example, having a thickness of approximately 1.0-1.5 μm) is made on the metal layer 330 through photo-lithographic technique, so as to leave the metal layer 330a exposed in correspondence of the thin portion of the bottom plate of the capacitor. The metal layer 330a being not protected by the mask 332 is then removed (for example, through a dry-etching operation).

The metal layer 330 is patterned so as to have an edge portion (in correspondence of the thin portion of the bottom plate of the capacitor) with a slanted profile; for example, a corresponding lateral surface of the metal layer 330a forms an angle ranging between approximately 50° and 80° with a lower surface thereof (in general, very slanted profiles having narrow angles may be preferred). Such result may be achieved by suitably shaping a corresponding edge portion of the mask 332 (through adjustment of the focus of the lamp used to develop the photo-resist material), and then regulating the polymerization during the etching operation of the metal layer 330a; alternatively, a similar result can be obtained by removing the metal layer 330a through a wet etching operation.

Figure 3C:
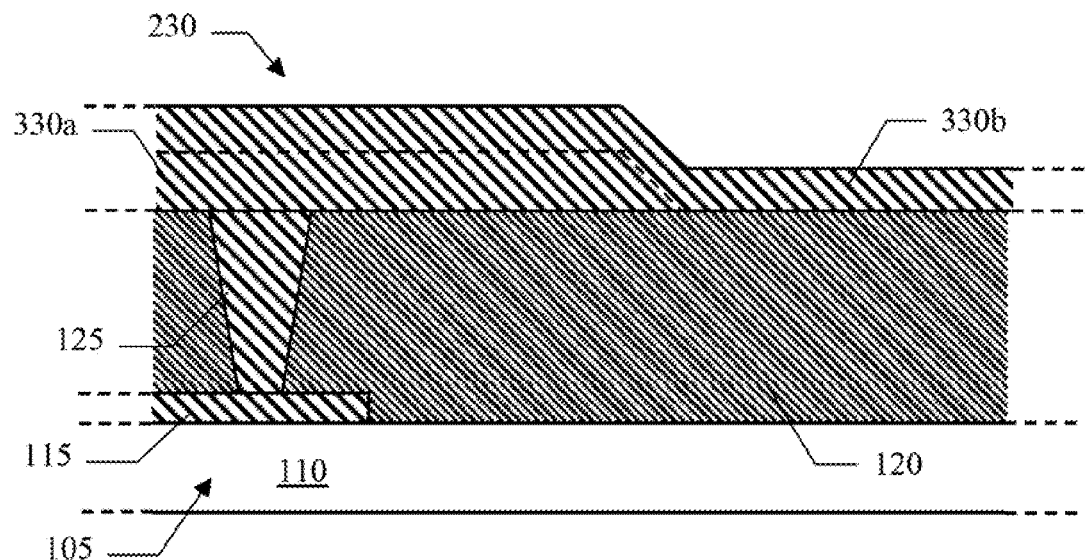

The process then proceeds to FIG. 3C, wherein the mask is stripped, and a further metal layer 330b is deposited on the metal layer 330a and on the free surface of the insulating layer 120; for example, the metal layer 330b is made of aluminum with a thickness of approximately 0.4-0.5 μm, and it is then subject to an Anti-Reflection Coating (ARC) treatment to reduce the interference of light being reflected by it during the development of photo-resist material in the next photo-lithographic operations. In this way, the set of the metal layers 330a and 330b defines the above-described metal layer 230 (having a non-uniform thickness).

An exposed surface of the metal layer 330a may previously be cleaned for removing a native oxide layer that may naturally form on it (so as to ensure continuity between the metal layers 330a and 330b). For example, for this purpose the metal layer 330a may be subject to a soft sputter operation, which removes a thin surface layer thereof (for example, approximately 0.01-0.03 μm). It is noted that such a cleaning operation may generate residues that are scattered within a process chamber. However, although the cleaning operation relates to a very wide area, since the metal layer 330a covers the whole wafer with the exception of the regions corresponding to the thin portions of the capacitors (for example, approximately 92-98%), surprisingly such operation typically does not damage significantly the process chamber (in contrast with the widespread technical prejudices against this process in the field).

Furthermore, the slanted profile of the edge portion of the metal layer 330a may greatly facilitate the filling of the edge region between the metal layer 330a and the insulating layer 120 by the metal layer 330b; this allows avoiding (or at least substantially reducing) the formation of imperfections (that is, air bubbles) within the metal layer 230 in correspondence to the thick portion of the bottom plate of the capacitor, which imperfections may compromise the electrical properties thereof.

Figure 3D:
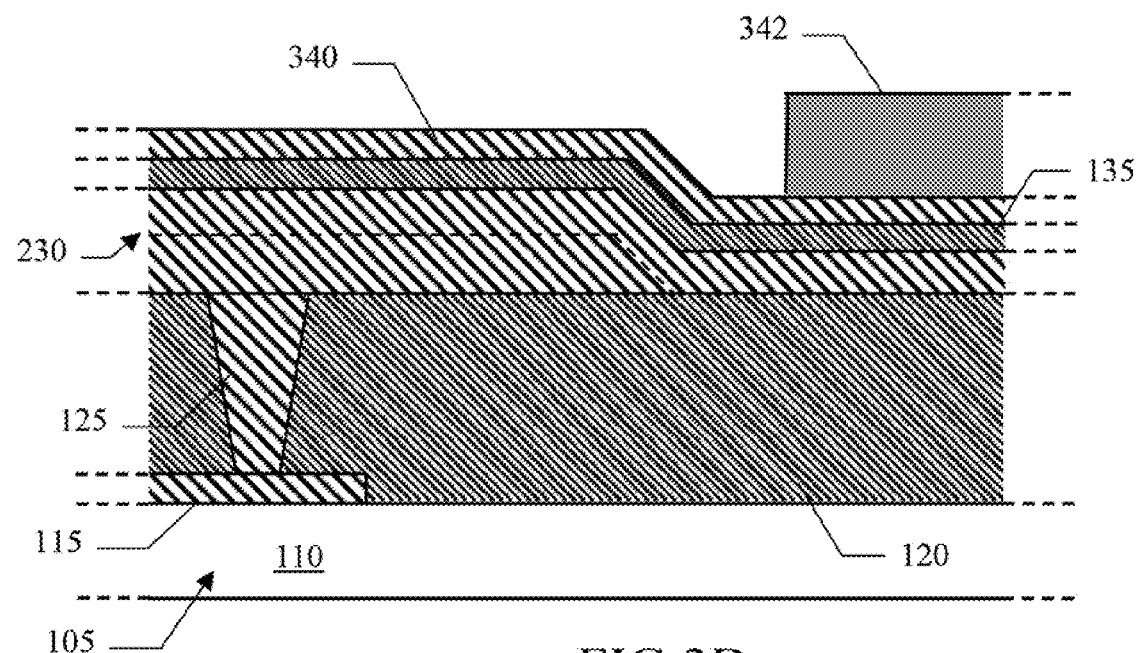

Considering now FIG. 3D, the insulating layer 135 is deposited on the metal layer 230, for example, the insulating layer 135 is made of silicon nitride with a thickness of approximately 30-40 nm. A metal layer 340 (for the top plate of the capacitor) is then deposited on the insulating layer 135; for example, the metal layer 340 is made of aluminum with a thickness of approximately 0.2-0.4 μm, and is then subject to an ARC treatment.

A photo-resist mask 342 (for example, having a thickness of approximately 1.0-1.5 μm) is made on the metal layer 340 through photolithographic technique, in order to protect the metal layer 340 in correspondence of the top plate of the capacitor. The metal layer 340 being not protected by the mask 342 is then removed (for example, through a dry-etching operation effective on the metal but not on the silicon nitride).

Figure 3E:
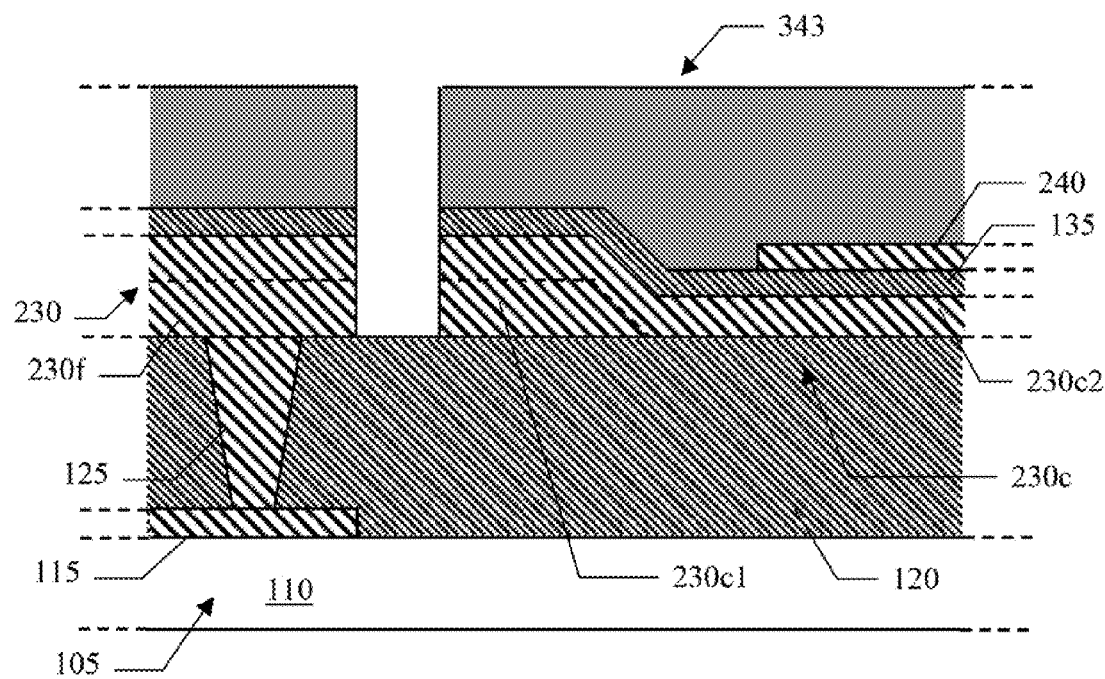

In this way, as shown in FIG. 3E, the top plate 240 is obtained. The mask is then stripped, and a further photo-resist mask 343 (for example, having a thickness of approximately 1.2-1.6 μm) is made on the structure thus obtained through a photolithographic technique, so as to protect the region in correspondence to the functional portion of the metal layer 230 (used for contacting the functional components 110) and the bottom plate of the capacitor. The insulating layer 135 and the metal layer 230 not protected by the mask 343 are then removed until reaching the insulating layer 120 (for example, through a dry etching operation). In this way, the functional metal layer 230f (suitably patterned by the mask 343 outside the capacitor) and the bottom plate 230c of the capacitor itself are obtained. In particular, the bottom plate 230c includes the thick portion 230c1 (with double metal layer) and the thin portion 230c2 (with single metal layer).

Figure 3F:
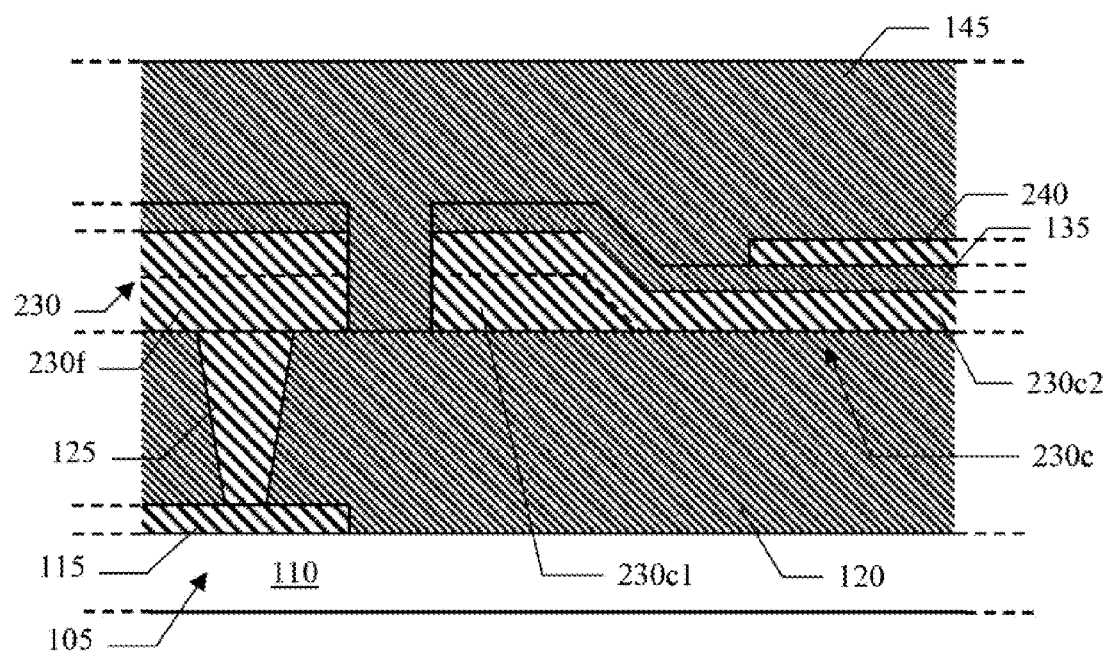

With reference now to FIG. 3F, the mask is stripped, and the insulating layer 145 is deposited on the structure thus obtained; for example, the insulating layer 145 is made of silicon oxide, having a thickness of approximately 0.7-1.0 μm.

Figure 3G:
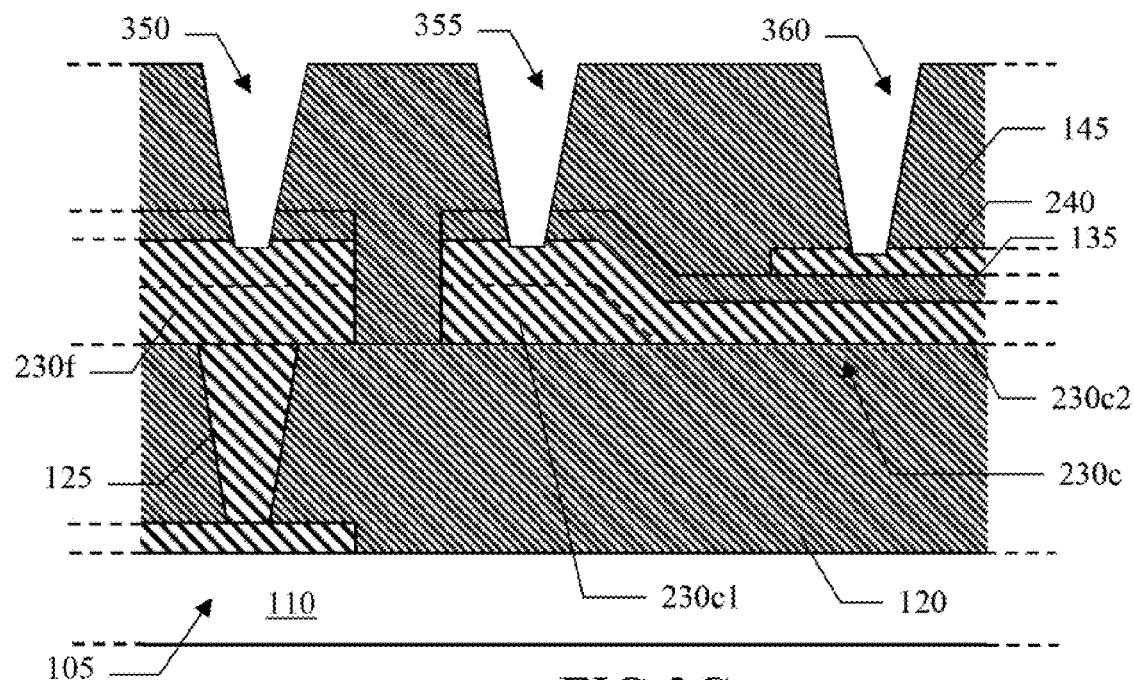

Turning to FIG. 3G, in the insulating layer 145 there are formed holes 350 to reach the functional metal layer 230f, a hole 355 to reach the thick metal layer 230c1 of the bottom plate 230c, and a hole 360 to reach the top plate 240 (for example, through selective dry etching techniques). All the holes 350, 355 and 360 may have a relatively high depth (for example, approximately 0.7-1.2 μm). In particular, the hole 360 may be deeper than the others to avoid any risk of over etch of the layer 240 and of damage of the insulator 135. Therefore, the operation of via formation may have no substantial criticalities (and may be performed without any detection system of a stop-point).

Figure 3H:
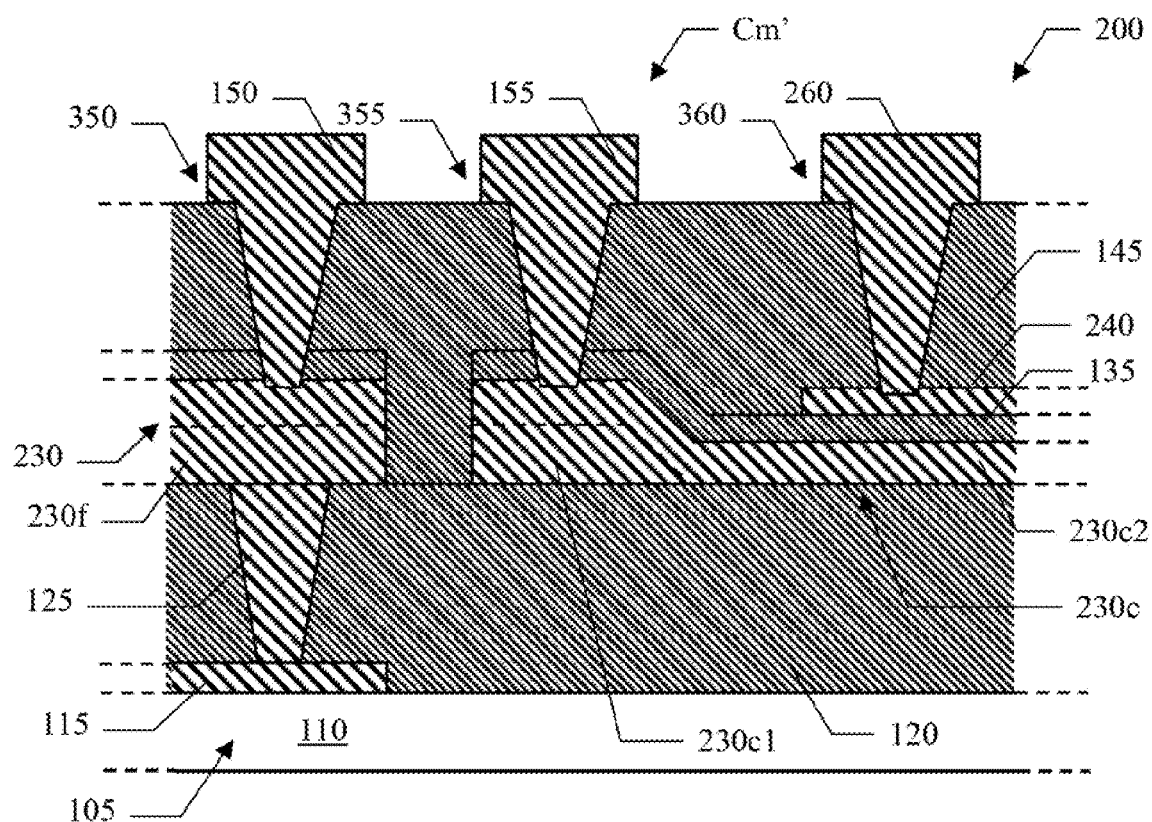

At the end, as shown in FIG. 3H, the contacts 150, 155 and 260 are formed in correspondence to the holes 350, 355 and 360, respectively. For this purpose, the holes 350, 355 and 360 are filled with metal (for example, tungsten or aluminum). A metal layer (for example, aluminum or copper with a thickness of approximately 2-4 μm) is then made through deposition and respective patterning with a photolithographic technique; for example, in case the metal layer is made of copper, such step may be compatible with both a localized deposition process and a Damascene-type process. In such way, the above-described electronic device 200 (with the respective capacitor Cm') is obtained.

Figure 4:
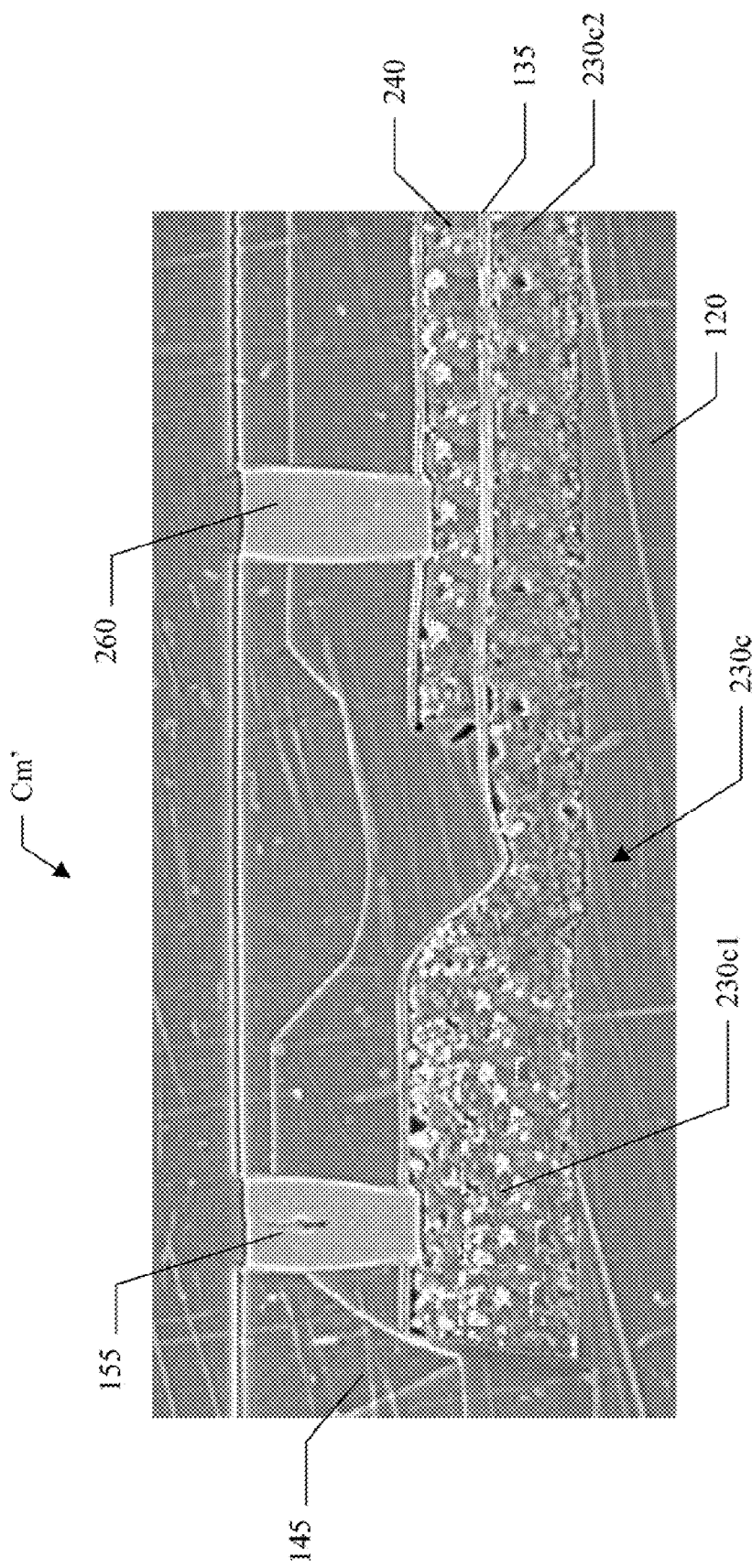
FIG. 4 is a cross-section view of a portion of a prototype of an electronic device according to an embodiment of the disclosure.

A cross-section view of a portion of a prototype of an electronic device so obtained, wherein it is clearly visible the structure of the capacitor Cm', is illustrated in FIG. 4.

Naturally, in order to satisfy local and specific requirements, a person skilled in the art may apply to the above-described techniques and structures many logical and/or physical modifications and alterations. More specifically, although this description has been described with a certain degree of particularity with reference to one or more embodiments thereof, it should be understood that various omissions, substitutions, and changes in the form and details, as well as other embodiments, are possible. Different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

In particular, similar considerations apply if the electronic device (and particularly the capacitor) has a different structure or includes equivalent elements; moreover, the elements can be separated from each other or combined together, in whole or in part. For example, each element of the electronic device may have any shape and/or size, and may be made of any other material. Moreover, the reference to the MIM capacitors should not be interpreted in a limited way (with the same solution that may also be applied to other types of capacitors, for example, of MOM-type). Anyway, nothing prevents implementing any one of the plates of the capacitor, or even both of them, with non-uniform thickness.

Similar considerations may apply if the thick metal layer and/or the thin metal layer have different size, thickness, or are electrically contacted by other means (for example, with terminals having other shapes).

Although in the above description explicit reference to the BCD technology has been made, this should not be interpreted in a limitative way; in fact, the same technique may be used in electronic devices made with any other technology (of the signal, power and mixed type), which may have any number of metal levels.

In an alternative embodiment of the present disclosure, the top plate (in addition or in an alternative to the bottom plate) is made with a non-uniform thickness. For example, this may be applied to structures that are located along scribe-lines of the wafer, such as lithographic structures, process monitoring structures, and basic components of any electronic device for parametric measures. For example, suitable process monitoring structures include capacitors for measuring the dielectric thickness between two metal layers; in this case, it may be possible to make the prevalent portion of the top plate with a reduced thickness (for example, approximately 0.5-2 μm), since this does not impact the functionality of the capacitor for performing the required measures; on the contrary, a limited portion of the top plate may be made with a greater thickness (equal to that of the corresponding metal layer, for example, approximately 2-4 μm). Such implementation may greatly facilitate the cutting operations of the wafer at the end of the production process of the electronic devices, since this may avoid (or at least may greatly reduce) the risk of chipping the (very large) metal layers used for making the plates of the capacitors.

Nothing prevents making the capacitor plates with different thicknesses; in particular, the top plate may be at any depth (even slightly lower than that of the thick metal layer of the bottom plate).

The above-described production-process embodiments of the capacitor are merely illustrative and in no way exhaustive. For example, the same or a similar result may be achieved with equivalent processes (by using similar steps, removing some steps being non-essential, or adding further optional steps); moreover, the steps may be performed in a different order, concurrently, or in an interleaved way (at least in part).

For example, the metal layers (or any equivalent material layers) may be deposited through other techniques, the first metal layer (used to form the double metal layer structure) may be etched with other techniques, or it may be deposited directly in a selective way.

Equivalent operations may be performed to clean the exposed surface of the first metal layer; anyway, the possibility of omitting such operation in specific implementations of the proposed production process is not excluded.

Analogous considerations apply if the edge portion of the first metal layer has a different slanted profile, or if the edge thereof is simply smoothed; moreover, such result may be obtained with other techniques (for example, through gray-levels developed masks), or even with selective etchings after the making of the first metal layer with a sharp edge. Anyway, such step is not strictly necessary, and it may be omitted in a simplified implementation of the proposed solution (for example, by making the edge portion with a right-angle profile when the deposition technique of the second metal layer is optimized to avoid the formation of imperfections).

The designs of the embodiments of the electronic device described above may also be created in a programming language; moreover, if the designer does not manufacture chips or masks, the design may be transmitted by physical means to third parties. In any case, the resulting integrated circuit may be distributed by its manufacturer in raw wafer form, as a bare die, or in packages. Moreover, one or more of the proposed embodiments may be integrated with other circuits in the same chip, or may be mounted in intermediate products (such as mother boards) and coupled with one or more other chips (such as a processor or a memory). In any case, the integrated circuit may be suitable to be used in complex systems (such as logic computers), where the integrated circuit may be coupled to one or more other integrated circuits, at least some of which may be in the same or different dies.

From the foregoing it will be appreciated that, although specific embodiments have been described herein for purposes of illustration, various modifications may be made without deviating from the spirit and scope of the disclosure.

Furthermore, where an alternative is disclosed for a particular embodiment, this alternative may also apply to other embodiments even if not specifically stated.

The invention claimed is:

1. An electronic device integrated in a chip of semiconductor material, comprising:
   a capacitor having a first conductive plate, a second conductive plate, and an insulating layer for isolating the first conductive plate from the second conductive plate,
   wherein the first conductive plate has a flat bottom surface and a tapering non-uniform thickness including a first relatively thicker region and a second relatively thinner region;
   wherein the second conductive plate has a uniform thickness separated from the second relatively thinner region of the first conductive plate by the insulating layer;
   an insulating cover layer disposed over the first and second conductive plates; and
   a first contact element extending through the insulating cover layer to make electrical connection to a flat top surface of the first conductive plate at the first relatively thicker region, wherein said flat top surface is on an opposite side of the first conductive plate from the flat bottom surface.

2. The electronic device according to claim 1, further comprising a second contact element extending through the insulating cover layer to make electrical connection to a flat top surface of the second conductive plate.

3. The electronic device according to claim 1, further including a set of functional components, and a functional metallic layer electrically connected to the functional components, wherein the flat bottom surface of the first conductive plate is coplanar with a flat bottom surface of the functional metallic layer, and wherein the thickness of the first relatively thicker region is equal to a thickness of the functional metallic layer.

4. The electronic device according to claim 1, wherein the first conductive plate, the insulating layer and the second conductive plate are embedded in the chip, the first conductive plate, the insulating layer and the second conductive plate being stacked.

5. The electronic device according to claim 2, wherein the first contact element extends from a top surface of the insulating cover layer to make electrical connection to the first conductive plate with a first depth, and wherein the second contact element extends from a top surface of the insulating cover layer to make electrical connection to the second plate with a second depth greater than the first depth.

6. A semiconductor structure, comprising:
   a first conductive layer including a first region having a first thickness and having a second region having a second thickness that is greater than the first thickness;
   a first insulator layer disposed over the first and second regions of the first conductive layer and having a thickness; and
   a second conductive layer disposed over the insulator layer and the first region of the first conductive layer, the second conductive layer having a thickness;
   wherein the second thickness of the second region of the first conductive layer is approximately equal to the sum of the first thickness of the first region of the first conductive layer, the thickness of the insulating layer and the thickness of the second conductive layer.

7. The semiconductor structure of claim 6 wherein the first conductive layer further includes a slanted transition region between the first and second regions.

8. The semiconductor structure of claim 6, further comprising:
   an upper surface disposed over the second conductive layer;
   wherein the first conductive layer further includes a transition region between the first and second regions, the transition region having a transition surface that is neither parallel nor normal to the upper surface.

9. The semiconductor structure of claim 6, further comprising:
   an upper surface disposed over the second conductive layer;
   wherein the first conductive layer further includes a transition region between the first and second regions, the transition region having a transition surface that is at an obtuse angle relative to the upper surface.

10. The semiconductor structure of claim 6, further comprising:
    an upper surface disposed over the second conductive layer;
    wherein the first conductive layer further includes a transition region between the first and second regions, the transition region having a transition surface that is at an acute angle relative to the upper surface.

11. The semiconductor structure of claim 6 wherein the first conductive layer comprises a metal.

12. The semiconductor structure of claim 6 wherein:
    the first region of the first conductive layer includes a first substantially planar surface facing the insulator layer; and
    the second conductive layer includes a second substantially planar surface facing the insulating layer, the first surface substantially parallel to the second surface.

13. The semiconductor structure of claim 6 wherein the second conductive layer has a third thickness that is less than the first thickness.

14. The semiconductor structure of claim 6 wherein the second conductive layer comprises a metal.

15. The semiconductor structure of claim 6 wherein the first and second conductive layers form a capacitor.

16. The semiconductor structure of claim 6, further comprising:
    a first electrode in electrical contact with the second region of the first conductive layer; and
    a second electrode in electrical contact with the second conductive layer.

17. The semiconductor structure of claim 6 wherein the second conductive layer is laterally remote from the second region of the first conductive layer.

18. The semiconductor structure of claim 6 wherein: the first conductive layer further includes a slanted transition region between the first and second regions; and
    the second conductive layer is laterally remote from the transition region of the first conductive layer.

19. The semiconductor structure of claim 6, further comprising a second insulator layer disposed under the first conductive layer.

20. An integrated circuit, comprising:
    a first conductive layer including a first region having a first thickness and having a second region having a second thickness that is greater than the first thickness;
    a first insulator layer disposed over the first and second regions of the first conductive layer; and
    a second conductive layer disposed over the insulator layer and the first region of the first conductive layer, the second conductive layer having a thickness;

wherein the second thickness of the second region of the first conductive layer is approximately equal to the sum of the first thickness of the first region of the first layer, the thickness of the insulating layer and the thickness of the second conductive layer.

21. The integrated circuit of claim 20 wherein:
the first conductive layer comprises a first electrode of a capacitor; and
the second conductive layer comprises a second electrode of the capacitor.

22. A method, comprising:
operating a semiconductor structure as a capacitor, the structure comprising:
  a first conductive layer having a first region of a first thickness and a second region of a second thickness that is greater than the first thickness;
  a first insulator layer disposed over the first and second regions of the first conductive layer; and
  a second conductive layer disposed over the insulator layer and over the first region of the first conductive layer, the second conductive layer having a thickness;
wherein the second thickness of the second region of the first conductive layer is approximately equal to the sum of the first thickness of the first region of the first layer, the thickness of the insulating layer and the thickness of the second conductive layer.

23. A semiconductor structure, comprising:
a first conductive layer having a first end and a second end, the first conductive layer including a first region at the first end having a first thickness and having a second region at the second end having a second thickness that is greater than the first thickness and a third region having a different thickness than the first and second region;
a first insulator layer disposed over first conductive layer; and
a second conductive layer having a substantially uniform thickness disposed over the insulator layer and the first region of the first conductive layer;
wherein the thickness of the second end is approximately equal to a sum of the thicknesses of the first region of the first conductive layer, the first insulator layer, and the second conductive layer.

* * * * *